United States Patent [19]

Pinkhasov

[11] Patent Number: 4,955,135

[45] Date of Patent: Sep. 11, 1990

[54] METHOD OF MAKING MATRIX COMPOSITES

[75] Inventor: Eduard Pinkhasov, Eastchester, N.Y.

[73] Assignee: Vapor Technologies Inc., Mt. Vernon, N.Y.

[21] Appl. No.: 272,557

[22] Filed: Nov. 16, 1988

[51] Int. Cl.$^5$ .............................................. B23P 17/00
[52] U.S. Cl. ..................................... 29/527.2; 75/230; 264/41; 427/37; 427/419.5; 427/419.6; 427/419.7
[58] Field of Search .......................... 29/527.2; 75/230; 428/378; 264/41; 427/37, 419.2, 419.5, 419.6, 419.7; 204/192.1, 192.12, 15

[56] References Cited

U.S. PATENT DOCUMENTS

| 4,076,888 | 2/1978 | Perugini et al. | 427/419.2 X |
| 4,808,481 | 2/1989 | Lukon | 428/378 X |
| 4,828,934 | 5/1989 | Pinkhasov | 427/419.2 X |
| 4,833,106 | 5/1989 | Horie | 75/230 X |

OTHER PUBLICATIONS

Physical Vapor Deposition of Ceramic Coatings for Gas Turbine Engine Components, R. E. Demaray et al., ASME ref 82-GT-264.
Ceramics At the Cutting Edge, by L. M. Sheppard, Advanced Materials and Processes Inc., Metal Progress 8/87, pp. 73-79.
Vapor-Phase Synthesis of Ceramics, by L. M. Sheppard, Advanced Materials and Processes Inc., Metal Progress 4/87, pp. 53-58.
"A Composites 'Wish List'", by E. J. Kubel, Jr., Advanced Materials and Processes Inc., Metal Progress 10/87, pp. 47-59.
$Si_3N_4$, Matrix Composite Development, by Kevin Haynes and Hun Yeh, AiResearach Casting Co., pp. 195-198.
Alumina-SiC Whisker Coomposites, by T. N. Tiegs and P. F. Becher, Oak Ridge National Laboratory, pp. 209-213.
Toughened Ceramics In the System $Al_2O_3$:$Cr_2O_3$/-$ZrO_2$:$HfO_2$, by T. Y. Tien et al., The University of Michigan Materials.Science and Engineering, pp. 215-220.
Development of Mullite/SiC Whisker Composites for Application in the Ceramic Technology for Advanced Heat Engine Program, by S. Musikant et al., pp. 227-231.

Primary Examiner—Carl E. Hall
Assistant Examiner—Carl J. Arbes
Attorney, Agent, or Firm—Herbert Dubno

[57] ABSTRACT

Matrix composites and especially metal matrix composites are formed by coating a foam with a metal or ceramic to form a continuous structure from which the foam material is removed by pyrolysis. If this structure is composed of a metal it is subjected to treatment to transform the metal to a ceramic and the resulting ceramic structure is then filled with another material such as a matrix metal. The product is then compacted and heat treated if desired. The coating of the foam and the filling of the porous ceramic structure are effected preferably by low temperature arc vapor deposition.

18 Claims, 1 Drawing Sheet

METHOD OF MAKING MATRIX COMPOSITES

CROSS REFERENCE TO RELATED APPLICATIONS

This application is related to my commonly owned copending applications Ser. No. 06/941,185, filed 12 Dec. 1986 (now U.S. Pat. No. 4,828,934 of a May 1989) and Ser. No. 07/208,886 filed 19 June 1988. Reference may also be had to the patents and other applications mentioned therein.

FIELD OF THE INVENTION

My present invention relates to matrix composites, especially metal matrix composites, and to a method of making same. More particularly, this invention relates to a method of making a matrix composite (MC) material in which a continuous phase is interlaced with a filamentary or stranded phase of a different composition from that of the continuous phase so as to impart unique strength, heat-resistance, superconductivity or other properties to the resulting material. In general, the filamentary phase will be in whole or in part a ceramic while the continuous phase can be a metal in the case of metal matrix composite (MMC) materials.

BACKGROUND OF THE INVENTION

It has long been recognized that heterophase solids might have unique properties which can be exploited for particular purposes. For example, esoteric metal structures have been developed in which a fiber phase is grown in situ in a continuous phase and the fiber phase consists of a metal carbide or one metal alloy or a metal of a particular crystillographic structure, while the continuous phase is the metal whose carbide forms the fibers, is another metal or a metal alloy, and can be used for high temperature applications in turbines or where high strength and high temperature strength are necessary.

In recent years, attention has turned to MC and MMC materials in which, in general, the filamentary phase has been formed from an accumulation of ceramic fibers which can be filled with the continuous phase, e.g. the metal phase.

In some cases, the ceramic of the filamentary phase is formed by depositing a ceramic coating on metal. Reference may be had, with respect to prior art techniques for depositing ceramic coatings, to the article entitled "Physical Vapor Deposition of Ceramic Coatings for Gas Turbine Engine Components", (by R.E. Demaray et al, ASME ref 82 - GT -264).

Ceramic fibers for rise in composites or otherwise are described in the article entitled "Ceramics at the 'Cutting Edge'", by L.M. Sheppard, advanced Materials and Processes Inc. METAL PROGRESS 8/87, pages 73 ff. "Vapor-Phase Synthesis of Ceramics" by L.M. Sheppard, op. cit 4/87 pages 53 ff describes various techniques for producing ceramics from a vapor phase.

"A Composites 'Wish List'", by E.J. Kubel, Jr., op. cit 10/87 pages 47 ff describes a variety of needs in the MC and MMC field.

Complex composites are described by Kevin Haynes and Hun Yeh in "$Si_3N_4$ Matrix Composite Development" and by T.N. Tiegs: and P.F. Becher in "Alumina-SiC Whisker Composites" and by T.Y. Tien, T.K. Brog and A.K. Li in "Toughened Ceramics in the System $Al_2O_3:CR_2O_3/ZrO_2:HfO_2$".

Attention may also be directed to the article by S.Musikant, S. Samanta, P. Architetto, and E. Feingold entitled "Development of Mullite/SiC Whisker Composites for Application in the Ceramic Technology for Advanced Heat Engine Program".

It will be apparent, therefore, that in recent years attention has turned to MC and MMC materials for a variety of purposes, especially where high strength, high resistance to heat and like characteristics are important.

While specifically I can mention applications of such materials to pistons in high temperature engines, turbine components and the like, such materials can be used as structural materials where very high strength and high temperature resistance is desired.

OBJECTS OF THE INVENTION

It is an object of my invention to provide an improved method of making MC and particularly MMC materials which is efficient, capable of producing improved products, and is applicable to a wide range of different composite materials.

Another object of this invention is to provide MC or MMC materials which can have characteristics selected in accordance with other compositions and which will be free from the problem of corrosion which has arisen in the past at contact junctions between individual fibers of the filamentary phase.

SUMMARY OF THE INVENTION

I have discovered that it is possible to make a matrix composite which avoids a major problem which has arisen in the past at least with some matrix composites. For example, where metal fibers of a discrete nature were packed and coated with ceramic and where ceramic fibers were assembled to form the filamentary phase of a matrix composite, there is invariably an interface at which contact occurs between two distinct filaments, fibers or whiskers Because composites vary from fiber to fiber, corrosion at such contact interfaces cannot be excluded and it has been found in practice that this corrosion is a significant problem which can be very detrimental to the quality of the product made.

I have now found that this problem can be eliminated altogether by forming the filamentary phase as a continuum so that all of the individual branches are interconnected and no contact interface exists.

This can be done by coating interstitial and external walls of a macroporous synthetic resin foam material with a metal or ceramic and then pyrolyzing the foam so as to form a body, after the foam material has been substantially completely eliminated, which is a continuous network and itself is a porous structure adapted to receive the matrix phase in the interconnected pores of this network When the network is composed at the outset from a ceramic, transformation of the network to a ceramic is not necessary. When, however, the network is composed of metal, I can transform it into a ceramic, e.g. by an anodizing, a nitriding or a carburization process so that substantially all of the metal is transformed into its oxide, carbide or boride More specifically, the method of the present invention can comprise the steps of:

(a) coating interstitial and external walls of a synthetic resin foam material with a first substance resistant to heat so as to form a body with a continuous network from the first substance;

(b) pyrolyzing the synthetic resin foam material of the body to substantially completely remove the synthetic resin material to leave a porous structure substantially free from interfaces between strands of the structure and constituted by the network;

(c) depositing a second substance in pores of the structure to substantially fill the same and form a matrix phase in which the porous structure is embedded; and (d) compacting the structure filled with the matrix phase to form the matrix composite.

I have discovered that in many cases it is not possible to directly fill a metal into the ceramic structure made as described above, especially when that ceramic structure consists of or includes refractory compounds such as aluminum oxide, silicon dioxide and silicon carbide.

Especially in such cases and in other cases in which the direct interface between certain metals and certain ceramics are temperature sensitive, it is essential to provide a barrier layer which may be very thin, but nevertheless is essential to permit effective bonding of the metal to the structure. Naturally, the interface between the metal which is subsequently deposited on the barrier layer should be one which is suitable with temperature variation and under thermal stress and the interface between the ceramic structure and the barrier layer should likewise be stable under thermal stress Preferably the barrier layer will comprise a metal such as nickel which can form effective interfaces with other metals like titanium and aluminum, for example, and with aluminum oxide and like ceramic structures.

More generally, however, the barrier layer will be a compound which itself has certain refractory properties. Compounds of this type can include titanium nitride, titanium oxide, titanium carbide, chromium oxide, chromium nitride and, in the case where the ceramic structure is composed of silicon carbide, even ceramic materials like aluminum oxide.

Advantageously, the barrier layer is deposited in the minimum thickness required for it to provide an interfacial bond as described, e.g. in a thickness as low as one micron, although thicknesses up to 20 micrors may be used. Preferably the barrier layer thickness is of the order of 3 to 10 microns in thickness with a most preferred range being 3 to 5 microns.

The barrier material is formed and the barrier layer is coated onto the ceramic structure, according to my invention, utilizing a low-temperature arc vapor deposition as described so that at least a metal forming a component of the barrier layer is vaporized in an evacuated chamber at a pressure of at most $10^{-3}$ torr by the striking of an arc between electrodes, at least one of which contributes the metal to the vapor phase.

The electrodes in this case can consist of the barrier material or the barrier material may be formed between materials of the two electrodes or by reaction with material vaporized from an electrode and a gas atmosphere remaining or fed into the evacuated chamber.

Advantageously, the interstitial and external walls of the synthetic resin foam material are coated with the first substance by striking an arc between electrodes across which a voltage of substantially 20 to 150 volts is applied, in an evacuated chamber, with an arc current of substantially 30 to 150 amperes to produce a vapor of the first substance in the chamber and deposit the first substance from the vapor onto and into the foam material in the chamber, at least one of the electrodes being constituted with at least one component of the first substance.

The coating component can be a metal which is selected from the group which consists of aluminum, zirconium, titanium, chromium, tantalum, molybdenum, boron and niobium and mixtures and alloys thereof or silicon, carbon or boron.

The structure can then be treated to transform the metal substantially throughout the thickness thereof to at least one ceramic compound, preferably an oxide, carbide or nitride.

In the preferred mode of transforming the metal to a ceramic compound, according to the invention, anodization is used. I have found that anodization, most surprisingly, is an extraordinarily effective transformation technique where the ceramic structure is formed of a foam substrate as described. The reason for this is that the nature of the foam material is such that many of the forms of this ceramic structure which results following pyrolysis and destruction of the foam, are hollow nodules and shells which may not be accessible to transformation by other techniques However, when anodization is used, I find that the anodization electrolyte effectively penetrates into these hollow nodules and that the anodization is effective from both sides of the ceramic-wall structures to the point that there is practically 100% transformation of the deposited material to the oxide.

When the first substance is a ceramic it is at least one oxide, nitride or carbide of at least one metal selected from the group which consists of aluminum, zirconium, titanium, chromium, tantalum, molybdenum, and niobium and mixtures and alloys thereof, or silicon, carbon or boron.

The matrix phase may be a ceramic of different composition from the filamentary phase or a metal, preferably selected from the group which consists of silver, copper, nickel, cobalt, vanadium, a rare-earth element, a platinum-group metal, aluminum, zirconium, titanium, chromium, tantalum, molybdenum, boron and niobium and mixtures and alloys thereof, or silicon or boron.

The second or matrix phase substance can be deposited in the pores of the structure to at least partially fill the same and preferably completely fill the pores, by striking an arc between electrodes across which a voltage of substantially 20 to 150 volts is applied, in an evacuated chamber, with an arc current of substantially 30 to 150 amperes to produce a vapor of the second substance in the chamber and deposit the second substance from the vapor onto and into the structure in the chamber, at least one of the electrodes being constituted with at least one component of the second substance.

The structure can be compacted after filling with the matrix phase to form the matrix composite at least in part by pressing the structure filled with the matrix phase and/or by heat treatment to densify the filled structure.

Advantageously the filled structure is rolled to a desired thickness.

Preferably, the foam, which can be any fully pyrolyzable foam with an appropriate porosity, is a reticulated ester-type polyurethane foam.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 2:
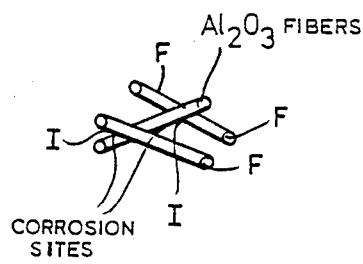
FIG. 2 is a diagram illustrating the filamentary phase of a prior art composite for the purposes of describing a problem associated therewith.

Referring first to FIG. 2, it can be recalled that in the past the filamentary phase of a matrix composite was frequently constituted from individual fibers F of, for example, $Al_2O_3$, which had interfaces I at which these fibers were in contact with one another. Because the compositions of the fibers were not always identical and because frequently the fibers were composed in whole or in part of corrodible materials, interfacial corrosion or other chemical phenomenon at the corrosion sites caused weakening of the fibers and of the fiber structure distributed in the matrix phase. The result was a deterioration of the properties of the matrix composite.

With the system of the present invention (see FIG. 3) the filamentary phase is a continuous porous structure S in which the metal matrix M is received as another continuum. The reason for this difference, of course, is that the ceramic forming the structure S is deposited upon the continuous interstitial and outer walls of the porous foam material which, when it is destroyed and eliminated from the structure, leaves a continuum of pores ultimately occupied by the metal continuous phase.

Turning then to FIG. I, it will be seen that the foam 10 on a support 11 in an evacuator chamber 12, can be coated with a metal, for example, aluminum or with silicon, or with one of the other metals mentioned above by striking an arc 13 between a pair of electrodes 14 and 15 at least one of which can be moved into contact with the other by an electrode reciprocating mechanism 16 or 17 as described generally in my copending application Ser. No. 07/208,886 a direct current voltage source 18 is connected across these electrodes and at least one of the electrodes is constituted of the metal to be deposited on the interstitial surfaces of the foam.

When the walls of the pores of the foam are coated with the metal, the resulting body consisting of the foam and the metal coating is subjected to pyrolysis at 20 (also see application Ser. No. 07/208,886 which is incorporated herein in its entirety by reference).

In most instances, the porous metal or ceramic structure which results from the pyrolysis will be subjected to a sintering step as represented at 25 and as has also been described in application Ser. No. 07/208,886. The sintering step renders the porous metal or ceramic structure fully coherent and stable.

The result is a porous metal structure which is delivered at 21 t o an anodization staqe 30 representing the treatment for transforming the metal of the porous structure to a ceramic, namely, the ceramic structure S previously described which does not possess any contact sites at which corrosion may occur.

The ceramic structure S resulting from the anodization or other treatment is coated with a barrier layer at stage 40 in a chamber 42. The ceramic structure S is provided on a support 41 in this chamber. Whereas the chamber 12 is evacuated down to vacuum of of $10^{-3}$ torr or better by the pump 19, the chamber 42 is evacuated to a pressure no higher than $10^{-3}$ torr by the pump 49.

The barrier coating is applied in a thin layer (up to 20 microns in thickness) on the ceramic structure by striking an arc 43 between a pair of electrodes 44, 45 which may be reciprocated by the devices 46, 47 as described in the application Ser. No. 07/208,886, to vaporize metal or one of the barrier materials mentioned from one or both of the electrodes into the chamber. A direct current source 48 is connected across the electrodes so as to provide the low temperature arc vapor deposition voltage and the requisite arc current.

The barrier layer which is applied at stage 40 can be in one or more of the materials previously described and capable of forming thermally stable interfacial bonds between the metal designed to fill the pores of the ceramic structure and the ceramic structure itself.

From the barrier layer application stage 40, the system porous structure S, now coated with the barrier layer in a thickness of, say, 4 microns, is positioned in a chamber 52 of the metal filling stage 50. In this stage, the ceramic structure S is mounted by means not shown between pairs of electrodes 54, 55 and 54', 55' which can be reciprocated by the mechanisms shown at 56, 57 and 56', 57', respectively, to strike electric arcs, supplied with electric current from the dc sources 58 and 58' utilizing the low-temperature arc vapor reposition techniques previously described. In the case in which titanium is the metal to be deposited, all of the electrodes can be composed of titanium.

In this step, like the barrier coating application, the voltage applied should be 20 to 150 volts and the arc current between 30 and 150 amperes.

The chamber may be evacuated by a pump 59 to a pressure of at most $10^{-3}$ torr although pressures as low as $10^{-5}$ torr are preferred. The porous structure is practically completely filled with the deposited metal.

The principles which are used, of course, can be the same of those set forth in the copending application Ser. No. 07/208,886.

The metal filled ceramic porous structure is compacted at 60, e.g. in a press.

Following such compaction, it is normally subjected to heat treatment at 70 for further densification of the MMC material which has thus been produced.

The material can be rolled at 80 to yield the finished product which is represented at 90.

Figure 3:
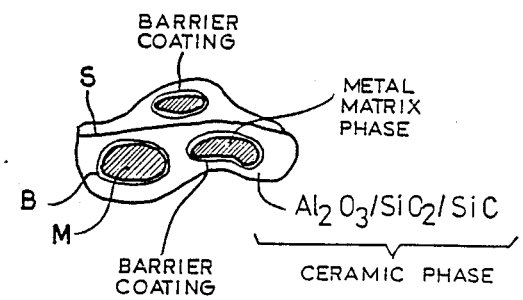
FIG. 3 is a diagram of a metal matrix composite in accordance with the present invention.

In FIG. 3 the barrier coating has been shown at B.

SPECIFIC EXAMPLE

Figure 1:
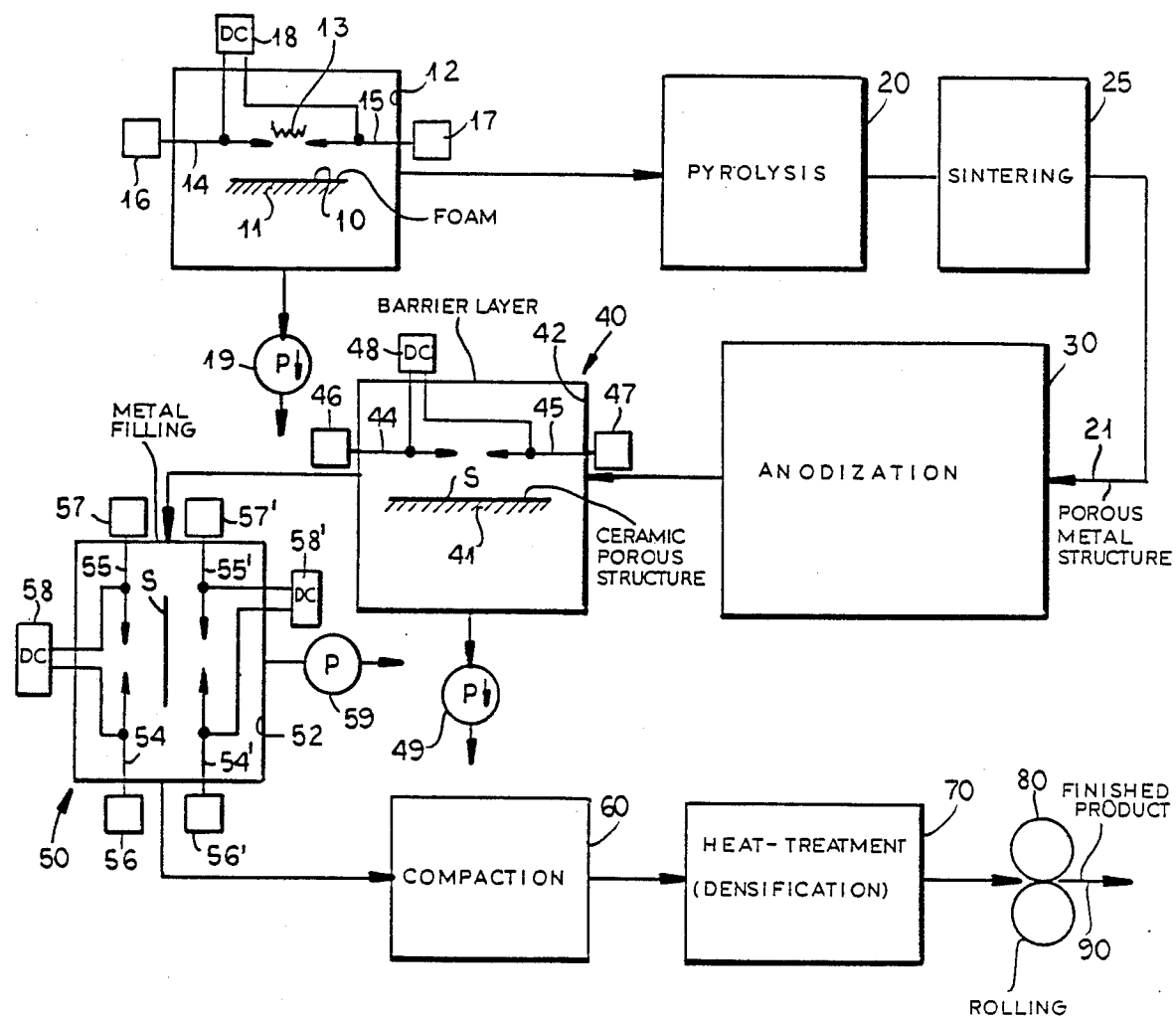
FIG. 1 is a flow diagram illustrating the production of a metal matrix composite in accordance with the invention.

A metal matrix composite with high temperature strength is made utilizing the method diagrammed in FIG. 1.

An 80-pores-per-inch open-pore flexible reticulated ester-type polyurethane foam of a density of about 1.75 pounds per cubic foot and a thickness of approximately 1/16 inch is subjected to low-temperature arc vapor deposition in a vacuum chamber in which a vacuum of $10^{-5}$ torr. has been drawn utilizing aluminum electrodes, an applied voltage of about 50 volts with an arc current of about 75 amperes. This step in the process is carried out until all surfaces of the pores are coated with aluminum. The thickness of the aluminum coating may be approximately 10 mils.

The coated foam (see the application Ser. No. 07/208,886) is subjected to pyrolysis in the presence of air in an electric furnace at 350° C. for two minutes until there has been full decomposition of the polyurethane structure and the residues have been drawn off.

The reticulated aluminum structure which results is then anodized until the aluminum is completely converted to $Al_2O_3$.

The ceramic structure can then be subjected to sintering at about 1100° C. for 55-60 minutes. With or without sintering it is coated with titanium nitride as a barrier layer stage 40 as illustrated in FIG. I by low temperature arc vapor deposition. Specifically an arc is struck with titanium electrodes in the chamber evacuated to $10^{-3}$ torr at a voltage of 60 volts with an arc current of 80 amperes and in the presence of nitrogen and titanium nitride is deposited in a layer of 5 microns thick on the aluminum oxide structure.

Following application of the barrier coating, the metal filling is introduced into the porous ceramic structure as represented at 50 in FIG. 1.

The arc is struck with titanium electrodes in the chamber evacuated to $10^{-5}$ torr and in the absence of nitrogen. The arc voltage was 60 volts and the arc current for each pair of electrodes was 80 amperes. The treatment is continued until the pores of the structure have been filled with metallic titanium.

To assist in filling that structure, the differential pressure method described in my copending application Ser. No. 07/276,068 filed 25 Nov. 1988, may be used.

After filling of the aluminum oxide structure with the titanium metal phase, the metal matrix composite is compacted with a pressure of about 150 pounds per square inch, heated at 1100° C. for 20 minutes and rolled to half its original thickness The result is a metal foil having high high-temperature strength and resistance to high temperatures in which the aluminum oxide continuous filamentary phase reinforces the titanium matrix phase.

I claim:

1. A method of making a matrix composite which comprises the steps of:
   (a) coating interstitial and external walls of a synthetic resin foax: material with a first substance resistant to heat so as to form a body with a continuous network from said first substance;
   (b) pyrolyzing said synthetic resin foam material of said body to substantially completely remove said synthetic resin material to leave a porous structure substantially free from interfaces between strands of said structure and constituted by said network;
   (c) depositing a second substance in pores of said structure to substantially fill the same and form a matrix phase in which said porous structure is embedded; and
   (d) compacting the structure filled with the matrix phase to form the matrix composite.

2. The method defined in claim 1 wherein a barrier coating is deposited on said porous structure subsequent to step (b) and prior to step (c) and consists of a material forming a thermally stable interfacial bond, said thermal structure and said second substance.

3. The method defined in claim 2 wherein said barrier coating consists of at least one substance selected from the group which consists of nickel, chromium, chromium nitride, chromium carbide, titanium oxide, titanium nitride, titanium carbide and aluminum oxide.

4. The method defined in claim 2 wherein said barrier coating is applied to said porous structure by striking an arc between electrodes across which a voltage of substantially 20 to 150 volts is applied, in an evacuated chamber, with an arc current of substantially 30 to 150 amperes to produce a vapor of a material of said barrier coating and deposit said material of said barrier coating on said substrate.

5. The method defined in claim 1 wherein said interstitial and external walls of said synthetic resin foam material are coated with said first substance by striking an arc between electrodes across which a voltage of substantially 20 to 150 volts is applied, in an evacuated chamber, with an arc current of substantially 30 to 150 amperes to produce a vapor of said first substance in said chamber and deposit said first substance from said vapor onto and into said foam material in said chamber, at least one of said electrode's being constituted with at least one component of said first substance 6. The method defined in claim 5 wherein said component is a metal or silicon or boron.

7. The method defined in claim 6 wherein said component is selected from the group which consists of aluminum, silicon, zirconium, titanium, chromium, tantalum, molybdenum, boron and niobium and mixtures and alloys thereof.

8. The method defined in claim 6, further comprising the step of treating said structure to transform said metal substantially throughout the thickness thereof to at least one ceramic compound whereby said structure is constituted as a continuous ceramic structure.

9. The method defined in claim 8 wherein said ceramic compound is an oxide, carbide or nitride.

10. The method defined in claim 8 wherein said structure is treated to transform said metal by anodization of said structure.

11. The method defined in claim 5 wherein said first substance deposited on said synthetic resin foam material is at least one ceramic compound whereby said structure is constituted as a continuous ceramic structure.

12. The method defined in claim 11 wherein said first substance is at least one oxide, nitride or carbide of at least one metal selected from the group which consists of aluminum, zirconium, titanium, chromium, tantalum, molybdenum, and niobium and mixtures and alloys thereof, or silicon or boron.

13. The method defined in claim 1 wherein said second substance is a metal forming said matrix phase or silicon or boron.

14. The method defined in claim 13 wherein said metal is selected from the group which consists of silver, copper, nickel, cobalt, vanadium, a rare-earth element, a platinum-group metal, aluminum, zirconium, titanium, chromium, tantalum, molybdenum, and niobium and mixtures and alloys thereof.

15. The method defined in claim 1 wherein said second substance is deposited in said pores of said structure to at least partially fill the same and form said matrix phase in which said porous structure is embedded by striking an arc between electrodes across which a voltage of substantially 20 to 150 volts is applied, in an evacuated chamber, with an arc current of substantially 30 to 150 amperes to produce a vapor of said second substance in said chamber and deposit said second substance from said vapor onto and into said structure in said chamber, at least one of said electrodes being constituted with at least one component of said second substance.

16. The method defined in claim 1 wherein the structure filled with the matrix phase is compacted to form the matrix composite at least in part by pressing the structure filled with the matrix phase.

17. The method defined in claim 1, wherein the structure filled with the matrix phase is compacted to form the matrix composite at least in-part by heat-treating the structure filled with the matrix phase, thereby densifying same.

18. The method defined in claim 1 wherein the matrix composite is rolled to a desired thickness following compaction thereof.

* * * * *